United States Patent
Kastler et al.

(10) Patent No.: US 8,389,670 B2
(45) Date of Patent: Mar. 5, 2013

(54) DITHIENOBENZO-THIENO[3,2-B]THIOPHENE-COPOLYMER AND ITS USE AS HIGH PERFORMANCE SOLUTION PROCESSABLE SEMICONDUCTING POLYMER

(75) Inventors: Marcel Kastler, Mannheim (DE); Silke Annika Koehler, Basel (CH); Klaus Muellen, Cologne (DE); Ralph Rieger, Darmstadt (DE)

(73) Assignees: BASF SE, Lugwigshafen (DE); Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 0 days.

(21) Appl. No.: 13/511,890

(22) PCT Filed: Nov. 29, 2010

(86) PCT No.: PCT/EP2010/068365
§ 371 (c)(1),
(2), (4) Date: May 24, 2012

(87) PCT Pub. No.: WO2011/067192
PCT Pub. Date: Jun. 9, 2011

(65) Prior Publication Data
US 2012/0289672 A1 Nov. 15, 2012

Related U.S. Application Data

(60) Provisional application No. 61/265,778, filed on Dec. 2, 2009.

(51) Int. Cl.
C08G 75/00 (2006.01)

(52) U.S. Cl. .................. 528/377; 528/380; 528/370

(58) Field of Classification Search .................. 528/377, 528/380, 370
See application file for complete search history.

(56) References Cited

U.S. PATENT DOCUMENTS

| | | | |
|---|---|---|---|
| 5,198,153 | A | 3/1993 | Angelopoulos et al. |
| 2005/0082525 | A1 | 4/2005 | Heeney et al. |
| 2009/0065770 | A1 | 3/2009 | Miura et al. |
| 2009/0261300 | A1 | 10/2009 | Watanabe |
| 2011/0136973 | A1 | 6/2011 | Kastler et al. |
| 2011/0155248 | A1 | 6/2011 | Kastler et al. |
| 2011/0168264 | A1 | 7/2011 | Kastler et al. |

FOREIGN PATENT DOCUMENTS

| | | |
|---|---|---|
| EP | 0 528 662 | 2/1993 |
| EP | 1 510 535 | 3/2005 |
| EP | 1 916 250 | 4/2008 |
| EP | 2 006 291 | 12/2008 |
| EP | 2 067 782 | 6/2009 |
| WO | 96 21659 | 7/1996 |
| WO | 2006 094645 | 9/2006 |
| WO | 2006 131185 | 12/2006 |
| WO | 2007 105386 | 9/2007 |

OTHER PUBLICATIONS

International Search Report Issued Jul. 14, 2011 in PCT/EP10/68365 Filed Nov. 29, 2010.

*Primary Examiner* — Shane Fang
(74) *Attorney, Agent, or Firm* — Oblon, Spivak, McClelland, Maier & Neustadt, L.L.P.

(57) ABSTRACT

Dithienobenzo-thieno[3,2-b]thiophene-copolymers of the formula (I) wherein: pi is a monocyclic or polycyclic moiety optionally substituted with 1-4 Ra groups, wherein $R^a$, at each occurrence, is independently hydrogen or a) a halogen, b) —(CN, c) —$NO_2$, d) oxo, e) —OH, f) =$C(R^b)_2$; g) a $C_{1-20}$ alkyl group, h) a $C_{2-20}$ alkenyl group, i) a $C_{2-20}$ alkynyl group, j) a $C_{1-20}$ alkoxy group, k) a $C_{1-20}$ alkylthio group, l) a $C_{1-20}$ haloalkyl group, m) a —Y—$C_{3-10}$ cycloalkyl group, n) a —Y—$C_{6-14}$ aryl group, o) a —Y-3-12 membered cycloheteroalkyl group, or p) a —Y-5-14 membered heteroaryl group, wherein each of the $C_{1-20}$ alkyl group, the $C_{2-20}$ alkenyl group, the $C_{2-20}$ alkynyl group, the $C_{3-10}$ cycloalkyl group, the $C_{6-14}$ aryl or haloaryl group, the 3-12 membered cycloheteroalkyl group, and the 5-14 membered heteroaryl group is optionally substituted with 1-4 $R^b$ groups; Y, at each occurrence, is independently a divalent $C_{1-6}$ alkyl group, a divalent $C_{1-6}$ haloalkyl group, or a covalent bond; and $R^1$, $R^2$, $R^3$, at each occurrence, are independently H, a halogen, CN, a $C_{1-30}$ alkyl group, a $C_{2-30}$ alkenyl group, a $C_{1-30}$ haloalkyl group, a $C_{2-30}$ alkynyl group, a $C_{1-30}$ alkoxy group, a C(O)—$C_{1-20}$ alkyl group, a C(O)—O$C_{1-20}$ alkyl group, a Y—$C_{3-10}$ cycloalkyl group, a —Y-3-12 membered cycloheteroalkyl group, each optionally substituted with 1-5 substituents selected from a halogen, —CN, a $C_{1-6}$ alkyl group, a $C_{1-6}$ alkoxy group, and a $C_{1-6}$ haloalkyl group, -L-$Ar^1$, -L-$Ar^1$—$Ar^1$, -L-$Ar^1$—$R^4$, or -L-$Ar^1$—$Ar^1$—$R^4$ and Y, at each occurrence, is independently a divalent $C_{1-6}$ alkyl group, a divalent $C_{1-6}$ haloalkyl group, or a covalent bond; n=0, 1, 2; and o=1-1000.

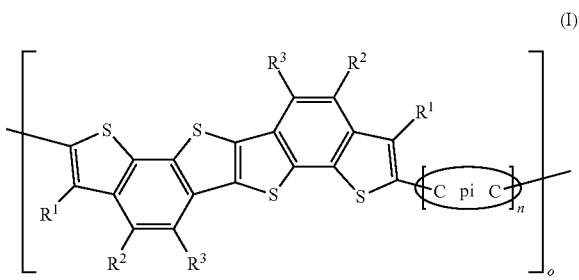

18 Claims, 1 Drawing Sheet

DITHIENOBENZO-THIENO[3,2-B]THIOPHENE-COPOLYMER AND ITS USE AS HIGH PERFORMANCE SOLUTION PROCESSABLE SEMICONDUCTING POLYMER

This application is a National Stage Entry of PCT/EP2010/068365, filed Nov. 29, 2010, the disclosure of which is incorporated by reference, and claims the benefit of the filing date of U.S. Provisional application Ser. No. 61/265,778, filed Dec. 2, 2009, the entire contents of which are hereby incorporated by reference.

BACKGROUND OF THE INVENTION

The present invention relates to dithienobenzo-thieno[3,2-b]thiophene-copolymers and their use as high performance solution processable semiconducting polymer.

The formidable building block for the development of (micro)electronics during the second one-half of the 20th century is the field-effect transistor (FET) based on inorganic electrodes, insulators, and semiconductors. These materials have proven to be reliable, highly efficient, and with performance that increases periodically according to the well-known Moore's law. Rather than competing with conventional silicon technologies, an organic FET (OFET) based on molecular and polymeric materials may find large scale applications in low-performance memory elements as well as integrated optoelectronic devices, such as pixel drive and switching elements in active-matrix organic light-emitting diode displays, RFID tags, smart-ID tags, and sensors.

As a result of the development of several conductive or semiconductive organic polymers, the application of those as active layer, thus the semiconductor, in organic thin-film transistors (OTFTs) has gained increasing attention.

The use of organic semiconductors in OTFTs has some advantages over the inorganic semiconductors used to date. They can be processed in any form, from the fiber to the film, exhibit a high mechanical flexibility, can be produced at low cost and have a low weight. The significant advantage is, however, the possibility of producing the entire semiconductor component by deposition of the layers from solution on a polymer substrate at atmospheric pressure and temperature, for example by printing techniques, such that inexpensively producible FETs are obtained.

The performance of the electronic devices depends essentially on the mobility of the charge carriers in the semiconductor material and the ratio between the current in the on-state and the off-state (on/off ratio). An ideal semiconductor therefore has a minimum conductivity in the switched-off state and a maximum charge carrier mobility in the switched-on state (mobility above $10^{-3}$ cm$^2$ V$^{-1}$ s$^{-1}$ on/off ratio above $10^2$). In addition, the semiconductor material has to be relatively stable to oxidation, i.e. has to have a sufficiently high ionization potential, since its oxidative degradation reduces the performance of the component.

EP 1 510 535 A1 describes polythieno(2,3-b)thiophenes which have a mobility of $3·10^{-3}$ or $1.7·10^{-2}$ cm$^2$ V$^{-1}$ s$^{-1}$ and on/off ratios of about $10^6$. WO2006/094645 A1 describes polymers which have one or more selenophene-2,5-diyl and one or more thiophene-2,5-diyl groups, while WO 2006/131185 discloses polythieno(3,4-d)thiazoles, and US 2005/0082525 A1 discloses benzo(1,2-b;4,5-b')dithiophenes.

WO2007/105386 discloses homo- and copolymers of substituted benzo[2,1-b;3,4-b']dithiophene having the following repeating units:

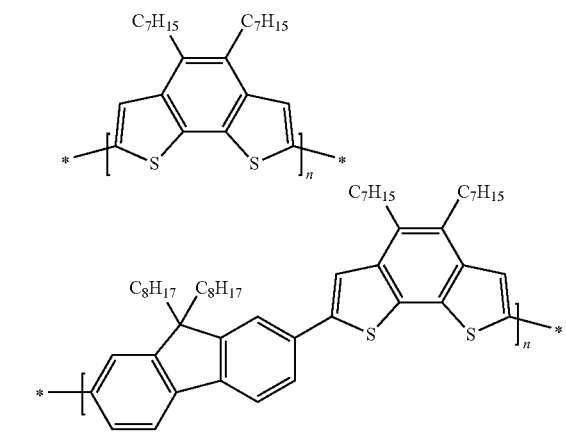

and having weight average molecular weights of up to $10^5$ g/mol. Both reported materials show charge carrier mobilities in the range of $10^{-5}$ to $10^{-3}$ cm$^2$/Vs.

Furthermore a copolymer with bisthiophene

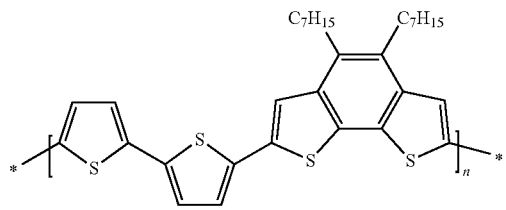

was reported which had only a weight average molecular weight of 4100 g/mol. This material showed only very poor performance in a field effect transistor (mobility: $1.6×10^{-5}$, on/off ratio: 100).

It is an object of the present invention to provide novel compounds for use as organic semiconductor materials, which are easy to synthesize, have high mobilities, a good stability, and can be processed readily.

BRIEF SUMMARY OF THE INVENTION

The object is achieved by A-B copolymers, wherein monomer A is an optionally substituted dithienobenzo-thieno[3,2-b]thiophene and monomer B is a π-conjugated moiety optionally functionalized with one or more electron withdrawing, electron donating or solublizing groups, the copolymers having the formula (I)

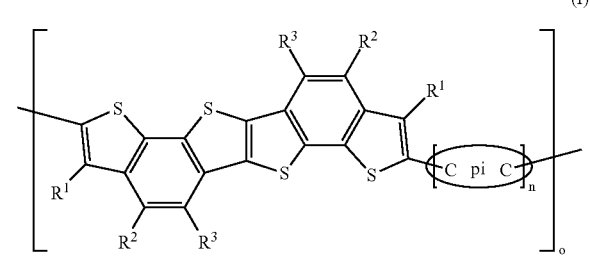

wherein:
pi is a monocyclic or polycyclic moiety optionally substituted with 1-4 R$^a$ groups, wherein $R^a$, at each occurrence, is independently hydrogen or a) a halogen, b) —CN, c) —NO$_2$, d) oxo, e) —OH, f) =C(R$^b$)$_2$; g) a C$_{1-20}$ alkyl group, h) a C$_{2-20}$ alkenyl group, i) a C$_{2-20}$ alkynyl group, j) a C$_{1-20}$ alkoxy group, k) a C$_{1-20}$ alkylthio group, l) a C$_{1-20}$ haloalkyl group, m) a —Y—C$_{3-10}$ cycloalkyl group, n) a —Y—C$_{6-14}$ aryl group, o) a —Y-3-12 membered cycloheteroalkyl group, or p) a —Y-5-14 membered heteroaryl group, wherein each of the C$_{1-20}$ alkyl group, the C$_{2-20}$ alkenyl group, the C$_{2-20}$ alkynyl group, the C$_{3-10}$ cycloalkyl group, the C$_{6-14}$ aryl or haloaryl group, the 3-12 membered cycloheteroalkyl group, and the 5-14 membered heteroaryl group is optionally substituted with 1-4 R$^b$ groups;

$R^b$, at each occurrence, is independently a) a halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_m$H, l) —S(O)$_m$—C$_{1-20}$ alkyl, m) —S(O)$_2$OH, n) —S(O)$_m$—OC$_{1-20}$ alkyl, o) —S(O)$_m$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S)NH—C$_{6-14}$ aryl, ah) —S(O)$_m$NH$_2$, ai) —S(O)$_m$NH(C$_{1-20}$ alkyl), aj) —S(O)$_m$N(C$_{1-20}$ alkyl)$_2$, ak) —S(O)$_m$NH(C$_{6-14}$ aryl), al) —S(O)$_m$N(C$_{1-20}$ alkyl)-C$_{6-14}$ aryl, am) —S(O)$_m$N(C$_{6-14}$ aryl)$_2$, an) SiH$_3$, ao) SiH(C$_{1-20}$ alkyl)$_2$, ap) SiH$_2$ (C$_{1-20}$ alkyl), ar) —Si(C$_{1-20}$ alkyl)$_3$, as) a C$_{1-20}$ alkyl group, at) a C$_{2-20}$ alkenyl group, au) a C$_{2-20}$ alkynyl group, av) a C$_{1-20}$ alkoxy group, aw) a C$_{1-20}$ alkylthio group, ax) a C$_{1-20}$ haloalkyl group, ay) a C$_{3-10}$ cycloalkyl group, az) a C$_{6-14}$ aryl or haloaryl group, ba) a 3-12 membered cycloheteroalkyl group, or bb) a 5-14 membered heteroaryl group;

Y, at each occurrence, is independently a divalent C$_{1-3}$ alkyl group, a divalent C$_{1-6}$ haloalkyl group, or a covalent bond; and m, at each occurrence, is independently 0, 1 or 2;

$R^1$, $R^2$, $R^3$, at each occurrence, are independently H, a halogen, CN, a C$_{1-30}$ alkyl group, a C$_{2-30}$ alkenyl group, a C$_{1-30}$ haloalkyl group, a C$_{1-20}$ alkynyl group, a C$_{1-30}$ alkoxy group, a C(O)—C$_{1-20}$ alkyl group, a C(O)—OC$_{1-20}$ alkenyl group, a Y—C$_{3-10}$ cycloalkyl group, a —Y-3-12 membered cycloheteroalkyl group, each optionally substituted with 1-5 substituents selected from a halogen, —CN, a C$_{1-6}$ alkyl group, a C$_{1-6}$ alkoxy group, and a C$_{1-6}$ haloalkyl group, -L-Ar$^1$, -L-Ar$^1$—Ar$^1$, -L-Ar$^1$—R$^4$, or -L-Ar$^1$—Ar$^1$—R$^4$ wherein:

L, at each occurrence, is independently —O—, —Y—O—Y—, —S—, —S(O)—, —Y—S—Y—, —C(O)—, —NR$^c$C(O)—, —NR$^c$—, —SiR$^c_2$—, —Y—[SiR$^c_2$]—Y—, a divalent C$_{2-30}$ alkyl group, a divalent C$_{1-30}$ alkenyl group, a divalent C$_{1-30}$ haloalkyl group, or a covalent bond;
wherein:

$R^c$, at each occurrence, is H, a C$_{1-20}$ alkyl group, or a —Y—C$_{6-14}$ aryl group;

Ar$^1$, at each occurrence, is independently a C$_{6-14}$ aryl group or a 5-14 membered heteroaryl group, each optionally substituted with 1-5 substituents selected from a halogen, —CN, a C$_{1-6}$ alkyl group, a C$_{1-6}$ alkoxy group, and a C$_{1-6}$ haloalkyl group; and $R^4$, at each occurrence, is independently a C$_{1-20}$ alkyl group, a C$_{2-20}$ alkenyl group, a C$_{1-20}$ haloalkyl group, a C$_{1-20}$ alkoxy group, -L'-Ar$^2$, -L'-Ar$^2$—Ar$^2$, -L'-Ar$^2$—R$^5$, or -L'-Ar$^2$—Ar$^2$—R;

wherein:

L', at each occurrence, is independently —O—, —Y—O—Y—, —S—, —S(O)—, —Y—S—Y—, —C(O)—, —NR$^c$C(O)—, —NR$^c$—, —SiR$^c_2$—, —Y—[SiR$^c_2$]—Y—, a divalent C$_{1-20}$ alkyl group, a divalent C$_{1-20}$ alkenyl group, a divalent C$_{1-20}$ haloalkyl group, or a covalent bond;

Ar$^2$, at each occurrence, is independently a C$_{6-14}$ aryl group or a 5-14 membered heteroaryl group, each optionally substituted with 1-5 substituents selected from a halogen, —CN, a C$_{1-6}$ alkyl group, a C$_{1-6}$ alkoxy group, and a C$_{1-6}$ haloalkyl group;

$R^5$, at each occurrence, is a C$_{1-20}$ alkyl group, a C$_{2-20}$ alkenyl group, a C$_{1-20}$ haloalkyl group, or a C$_{1-20}$ alkoxy group;

and Y, at each occurrence, is independently a divalent C$_{1-6}$ alkyl group, a divalent C$_{1-6}$ haloalkyl group, or a covalent bond;

n=0, 1, 2; and o=1-1 000.

In one embodiment, n=0. In a further embodiment, n=1. Preferably, o=5-1000, more preferably o=5-100.

DETAILED DESCRIPTION OF THE INVENTION

Figure 1:
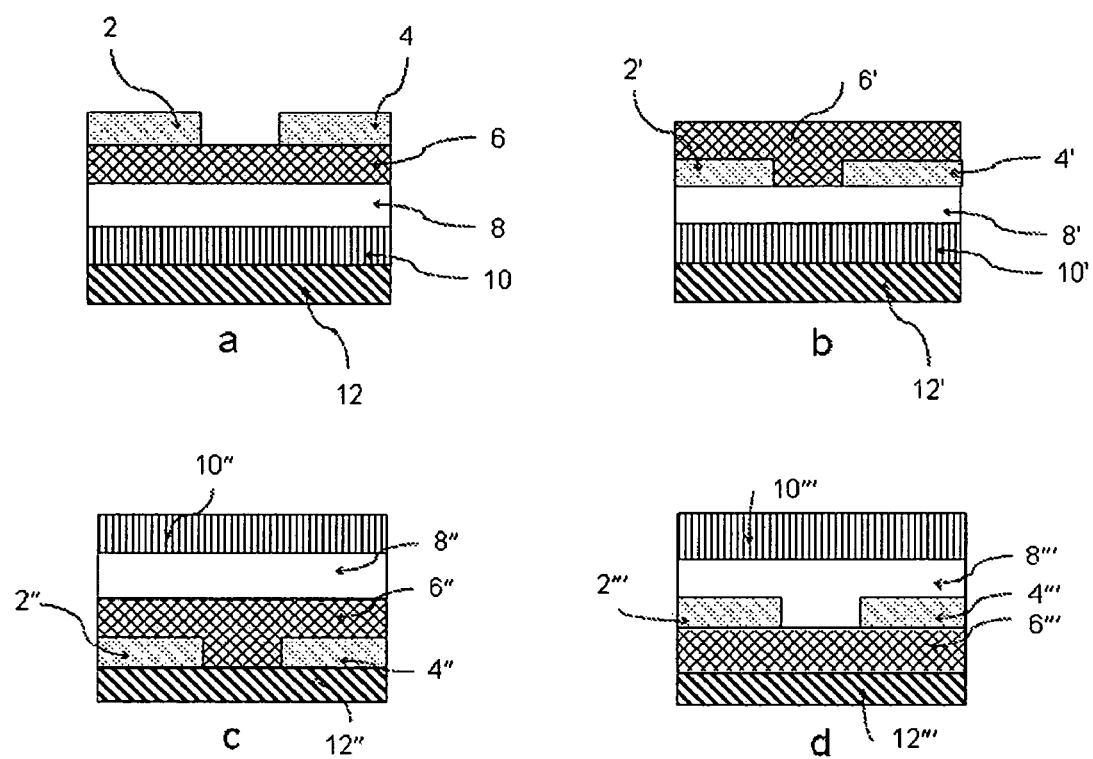
FIG. 1 illustrates the four common types of OFET structures.

In general, pi is a planar and highly conjugated cyclic core, wherein the ring atoms are covalently bonded with alternating single and double bonds. The highly conjugated and planar nature of such cores can promote π-electron delocalization (thereby increasing stability and lowering LUMO energy), and provide good intermolecular n-stacking. Examples of suitable cyclic cores include benzene, naphthalene, anthracene, tetracene, pentacene, perylene, pyrene, coronene, fluorene, indacene, indenofluorene, and tetraphenylene, as well as their analogs in which one or more carbon atoms are replaced with a heteroatom such as O, S, Si, Se, N or P.

Preferably, pi is an optionally substituted monocyclic, heterocyclic or polycyclic moiety selected from:

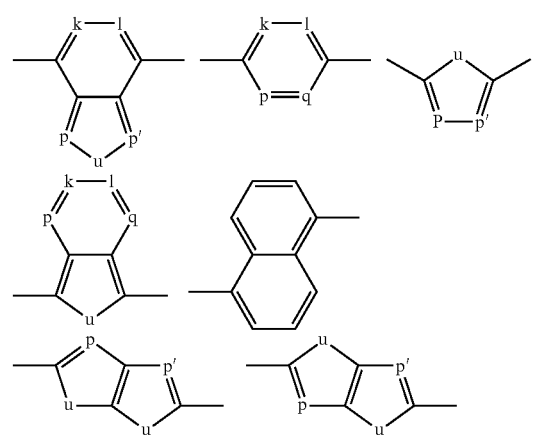

-continued

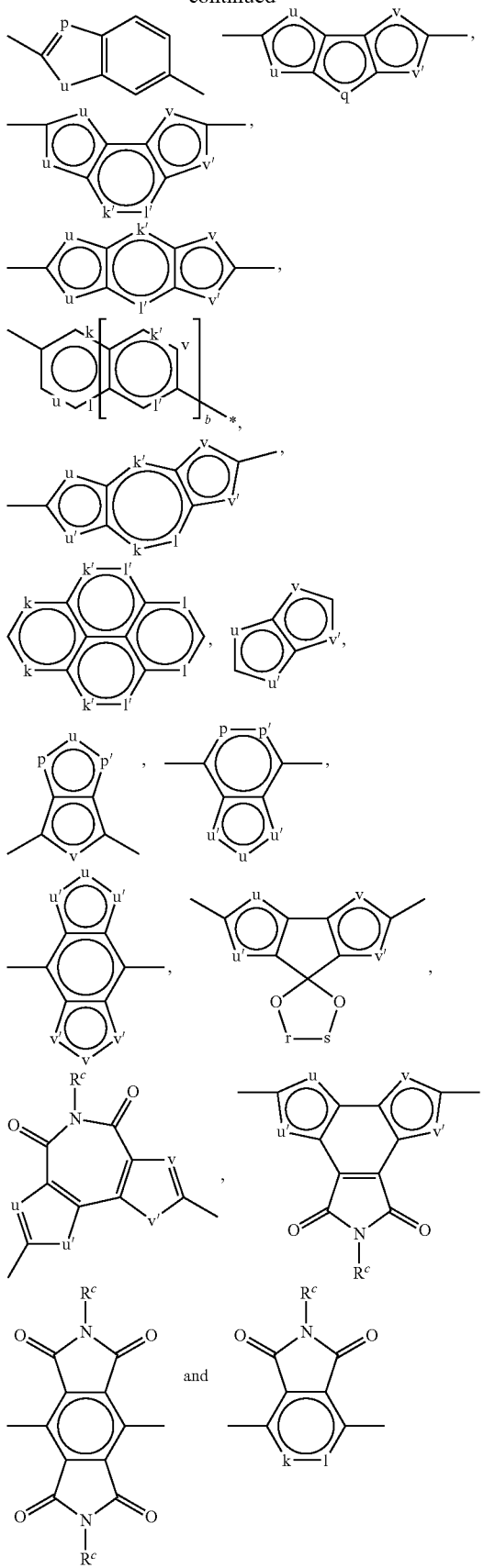

wherein:

k, k', l, l', p, p', q, u, u', v and v' independently are selected from —S—, —O—, —CH=, =CH—, —CR$^6$=, =CR$^6$—, —C(O)—, —C(C(CN)$_2$)—, —N=, =N—, —NH—, —NR$^3$—, —SiR$^c$=, =SiR$^c$—, and —SiR$^7$R$^c$—;

R$^6$, at each occurrence, is independently selected from a) halogen, b) —CN, c) —NO$_2$, d) N(R$^c$)$_2$, e) —OR$^c$, f) —C(O)R$^c$, g) —C(O)OR$^c$, h) —C(O)N(R$^c$)$_2$, i) a C$_{1-40}$ alkyl group, j) a C$_{2-40}$ alkenyl group, k) a C$_{2-40}$ alkynyl group, l) a C$_{1-40}$ alkoxy group, m) a C$_{1-40}$ alkylthio group, n) a C$_{1-40}$ haloalkyl group, o) a —Y—C$_{3-14}$ cycloalkyl group, p) a —Y—C$_{6-14}$ aryl group, q) a —Y-3-14 membered cycloheteroalkyl group, and r) a —Y-5-14 membered heteroaryl group, wherein each of the C$_{1-40}$ alkyl group, the C$_{2-40}$ alkenyl group, the C$_{2-40}$ alkynyl group, the C$_{3-14}$ cycloalkyl group, the C$_{6-14}$ aryl group, and the 3-14 membered cycloheteroalkyl group and Y and R$^c$ are as defined herein;

R$^c$ is as defined herein;

r and s independently can be —CR$^c$R$^c$— or —C(C(CN)$_2$)—; and b is 1,2, 3 or 4.

In certain embodiments, pi is a monocyclic, bicyclic or heterocyclic moiety including one or more thienyl, thiazolyl, or phenyl groups, where each of these groups can be optionally substituted as disclosed herein. For example, pi can be selected from

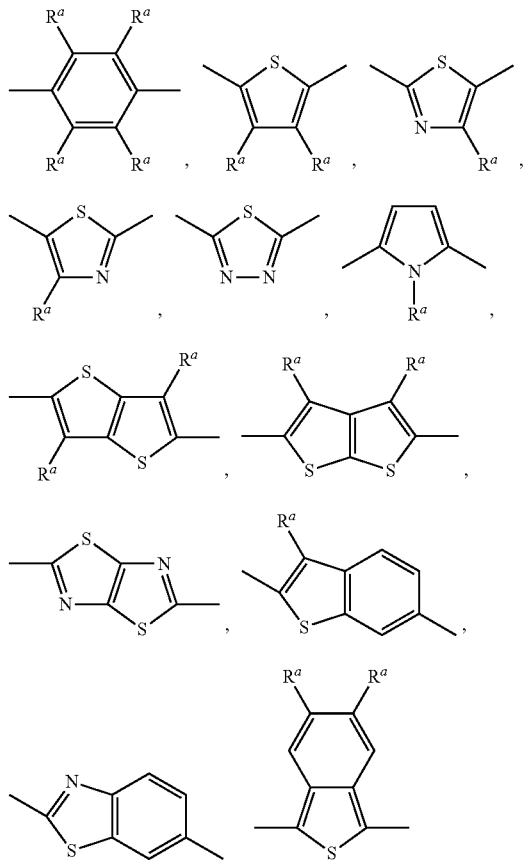

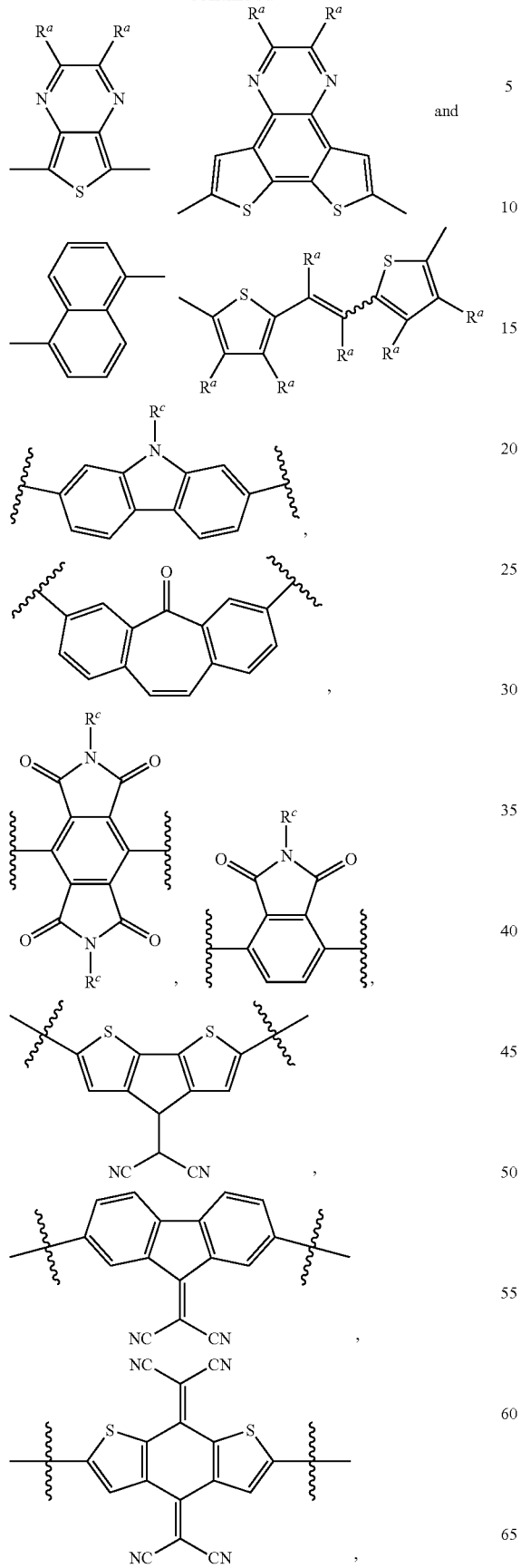
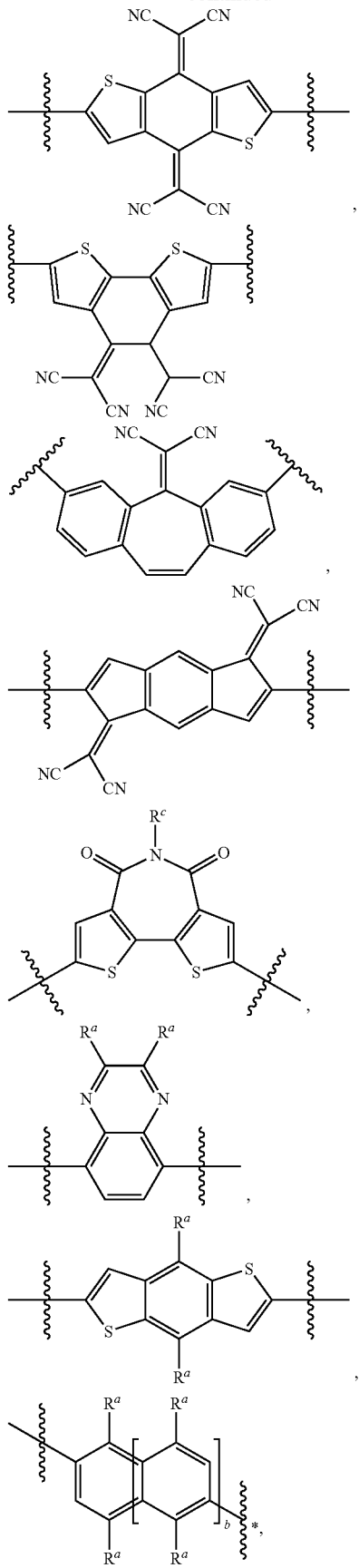

-continued

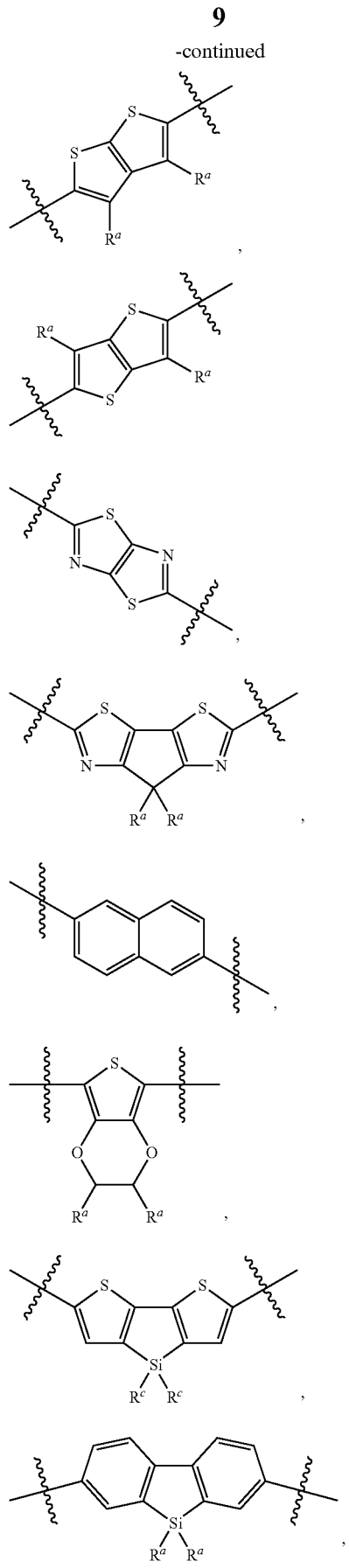

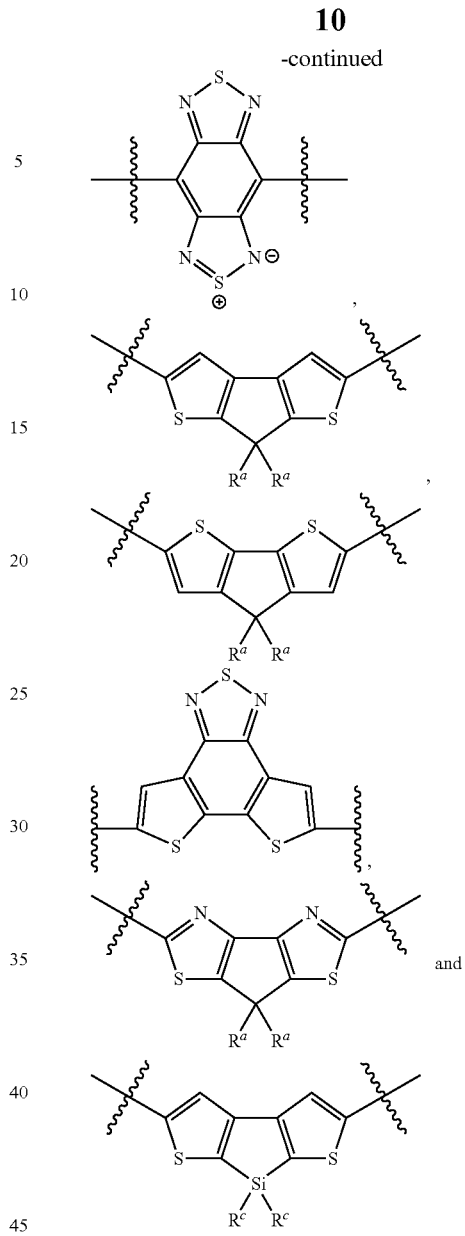

wherein $R^a$ and $R^c$ at each occurrence are as defined herein.

In a preferred embodiment, $R^1, R^2, R^3$ are independently selected from a $C_{1-20}$ alkyl group and a $C_{1-20}$ alkoxy group, wherein each of the $C_{1-20}$ alkyl groups or the $C_{1-20}$ alkoxy groups can optionally be substituted with 1-4 groups independently selected from a $C_{1-20}$ alkyl group and a $C_{1-20}$ alkoxy group.

In a particularly preferred embodiment $R^1, R^2, R^3$ are independently selected from a $C_{1-20}$ alkyl group, and each of the $C_{1-20}$ alkyl groups can optionally be substituted with 1-4 groups independently selected from a $C_{1-20}$ alkyl group.

Particularly preferred substituents $R^1, R^2, R^3$ are $C_{6-20}$ alkyl groups optionally substituted with 1-4 $C_1$-$C_6$ alkyl groups.

The number average molecular weight $M_n$ is preferably in the range of from 1000 to 200 000 g/mol, more preferably from 10000 to 100 000 g/mol.

"Alkenyl" refers to a straight-chain or branched alkyl group having one or more carbon-carbon double bonds. Examples are ethenyl, propenyl, butenyl, pentenyl, hexenyl, butadienyl, pentadienyl and hexadienyl groups. The one or more carbon-carbon double bonds can be internal (such as in 2-butene) or terminal (such as in 1-butene). In various embodiments, an alkenyl group can have 2 to 20 carbon atoms. In some embodiments, alkenyl groups can be substituted as disclosed herein. An alkenyl group is generally not substituted with another alkenyl group, an alkyl group, or an alkynyl group.

"Alkynyl" refers to a straight-chain or branched alkyl group having one or more triple carbon-carbon bonds. Examples include ethynyl, propynyl, butynyl, pentynyl. The one or more triple carbon-carbon bonds can be internal (such as in 2-butyne) or terminal (such as in 1-butyne). In various embodiments, an alkynyl group can have 2 to 20 carbon atoms. In some embodiments, alkynyl groups can be substituted as disclosed herein. An alkynyl group is generally not substituted with another alkynyl group, an alkyl group, or an alkenyl group.

"Cycloalkyl" refers to a non-aromatic carbocyclic group including cyclized alkyl, alkenyl, and alkynyl groups. A preferred cycloalkyl group can have 3 to 10 carbon atoms. A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. Cycloalkyl groups can be substituted as disclosed herein.

"Heteroatom" refers to an atom of any element other than carbon or hydrogen and includes, for example, nitrogen, oxygen, silicon, sulfur, phosphorus, and selenium.

"Cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 12 ring atoms. One or more N, P, S, or Se atoms (e.g., N or S) in a cycloheteroalkyl ring may be oxidized (e.g., morpholine N-oxide, thiomorpholine S-oxide, thiomorpholine S,S-dioxide). Nitrogen or phosphorus atoms of cycloheteroalkyl groups can bear a substituent, in particular an alkyl group. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Preferred cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl. Cycloheteroalkyl groups can be substituted or unsubstituted.

"Aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have from 6 to 14 carbon atoms in its ring system, which can include multiple fused rings. Preferred aryl groups having only aromatic carbocyclic ring(s) include phenyl, 1-naphthyl (bicyclic), 2-naphthyl (bicyclic), anthracenyl (tricyclic), phenanthrenyl (tricyclic). Preferred polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Further preferred aryl groups include benzodioxanyl, benzodioxolyl, chromanyl, indolinyl groups, and the like. In some embodiments, aryl groups can be substituted as disclosed herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted or unsubstituted.

"Heteroaryl" refers to an aromatic monocyclic or polycyclic ring system containing at least one ring heteroatom. The heteroatom is preferably selected from oxygen (O), nitrogen (N), sulfur (S), silicon (Si), and selenium (Se) or a polycyclic ring system without being restricted thereto. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group can have from 5 to 14 ring atoms and contain 1-5 ring heteroatoms. Particular examples of heteroaryl groups include, for example, the 5- or 6-membered monocyclic and 5-6 bicyclic ring systems shown below:

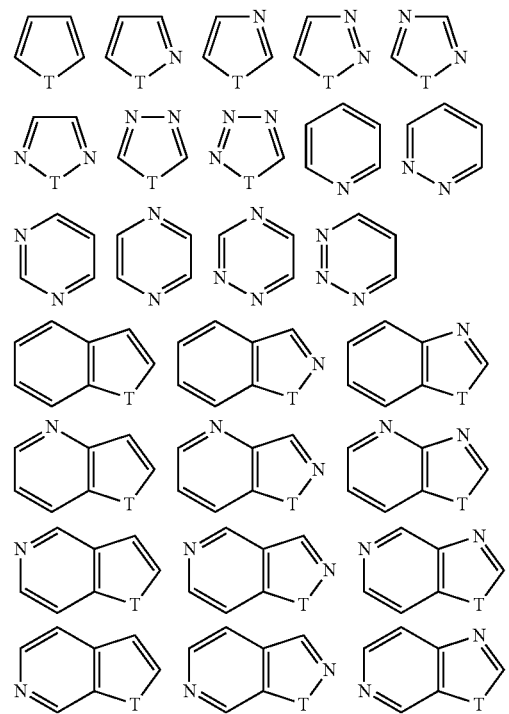

-continued

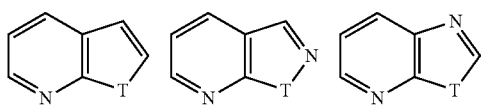

where T is O, S, NH, N-alkyl, N-aryl, N-(arylalkyl) (e.g., N-benzyl), $SiH_2$, SiH-(alkyl), Si(alkyl)$_2$, SiH-(arylalkyl), Si-(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as disclosed herein.

$R^1$, $R^2$, $R^3$ is particularly preferred linear or branched $C_6$-$C_{20}$ alkyl, e.g. n-hexyl, n-heptyl, n-octyl, n-nonyl, n-decyl, n-undecyl, n-dodecyl, n-tridecyl, n-tetradecyl, n-pentadecyl, nhexadecy, n-heptadecyl, n-octadecy, n-nonadecyl, n-isosyl, 1-methylpentyl, 1-methylhexyl, 2-methylpentyl, 2-ethylhexyl, and 2,7-dimethyloctyl. Particularly preferred are 2,6-dimethyloctyl, 1-ethylhexyl, 1-methylhexyl, 2-ethylpentyl, 2-methylhexyl, n-decyl, ndodecyl, n-tetradecyl, and 2-ethylhexyl, most preferred is n-dodecyl.

The copolymers of the present invention can be prepared according to Scheme 1 below:

Scheme 1

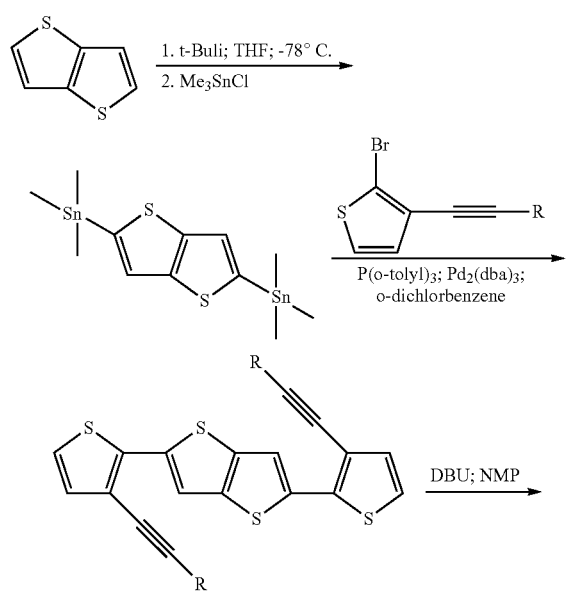

-continued

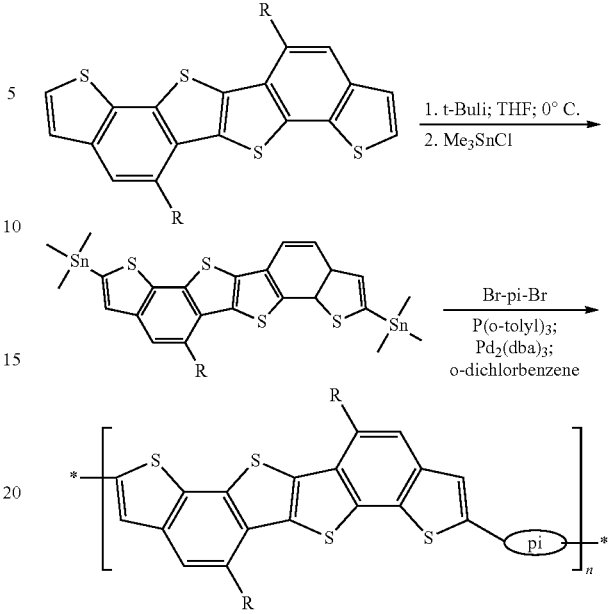

Referring to Scheme 1, certain embodiments of the present copolymers can be synthesized via a metal catalyzed Stille polymerization in the presence of tri-o-tolylphospine and Pd$_2$(dba)$_3$ (dba=dibenzylidene acetone).

1,3-bis(trimethylstannyl)-thieno[3,2-b]thiophene can be prepared by adding t-butyl lithium to thieno[3,2-b]thiophene in anhydrous THF, upon which a precipitate is formed. To the suspension, trimethyltin chloride is added as solid. The 1,3-bis(3-alkynyl-2-yl)thieno[3,2-b]thiophene is prepared by reacting 1,3-bis(trimethylstannyl)-thieno[3,2b]thiophene with 2-bromo-3-hexadecynylthiophene in the presence of tri-o-tolylphosphine and Pd$_2$(dba)$_3$ in anhydrous o-dichlorobenzene. The 4,8-bis(alkyl)dithienobenzo-thieno[3,2-b]thiophene can be obtained by adding DBU to the 1,3-bis(3-alkynyl-2-yl)-thieno[3,2-b]thiophene in NMP. The bis (alkyl)-dithienobenzo-thieno[3,2b]thiophene is in turn converted to the corresponding bistrimethylstannyl-compound by reaction with t-butyl lithium in anhydrous THF, followed by the addition of trimethyltin chloride. Polymerization of the organotin compound with the appropriate dibromide in the presence of tri-o-tolylphosphine and Pd$_2$ (dba)$_3$ leads to the desired copolymer.

The invention comprises both the oxidized and the reduced forms of the polymers according to the present invention. Either a deficiency or an excess of electrons leads to the formation of a delocalized ion which has a high conductivity. This can be done by doping with customary dopants. Dopants and doping processes are common knowledge and are known, for example, from EP-A 0 528 662, U.S. Pat. No. 5,198,153 or WO 96/21659. Suitable doping processes comprise, for example, doping with a doping gas, electrochemical doping in a solution comprising the dopant, by thermal diffusion and by ion implantation of the dopant into the semiconductor material.

In the case of use of electrons as charge carriers, preference is given to using halogens (e.g. $I_2$, $Cl_2$, $Br_2$, ICl, $ICl_3$, IBr and IF), Lewis acids (e.g. $PF_5$, $AsF_5$, $SbF_5$, $BF_3$, $BCl_3$, $SbCl_5$, $BBr_3$ and $SO_3$), inorganic acids (e.g. HF, HCl, $HNO_3$, $H_2SO_4$, $HClO_4$, $FSO_3H$ and $ClSO_3H$), organic acids or amino acids, transition metal compounds (e.g. $FeCl_3$, FeOCl, Fe(ClO$_4$)$_3$, Fe(4-CH$_3$C$_6$H$_4$SO$_3$)$_3$, TiCl$_4$, ZrCl$_4$, HfCl$_4$, NbF$_5$, NbCl$_5$, TaCl$_5$, MoF$_5$, MoCl$_5$, WF$_5$, WCl$_6$, UF$_6$ and LnCl$_3$ (where Ln is a lanthanoid)), anions (e.g. Cl$^-$, Br$^-$, I$^-$, I$_3^-$, HSO$_4^-$, SO$_4^{2-}$, NO$_3^-$, ClO$_4^-$, BF$_4^-$, PF$_6^-$, AsF$_6^-$, SbF$_6^-$, FeCl$_4^-$, Fe(CN)$_6^{3-}$, and anions of different sulfonic acids such as aryl-SO$_3^-$). In the case of use of holes as charge carriers, as dopants, for example, are cations (e.g. H$^+$, Li$^+$, Na$^+$, K$^+$, Rb$^+$ and Cs$^+$), alkali metals (e.g. Li, Na, K, Rb, and Cs), alkaline earth metals (e.g. Ca, Sr and Ba), O$_2$, XeOF$_4$, (NO$_2^+$) (SbF$_6^-$), (NO$_2^+$) (SbCl$_6^-$), (NO$_2^+$) (BF$_4^-$), AgClO$_4$, H$_2$IrCl$_6$, La(NO$_3$)$_3$, FSO$_2$OOSO$_2$F, Eu, acetylcholine, R$_4$N$^+$, R$_4$P$^+$, R$_6$As$^+$ and R$_3$S$^+$, where R is an alkyl group.

The conductive form of the copolymers according to the present invention can be used as an organic conductor, for example charge injection layers and ITO planarizing layers in organic light-emitting diodes (OLEDs), flat screens and touch screens, antistatic films, printed circuits and capacitors, without being restricted thereto.

The copolymers according to the present invention can be used to produce optical, electronic and semiconductor materials, especially as charge transport materials in field-effect transistors (FETs), for example as components of integrated circuits (ICs), ID tags or TFTs. Alternatively, they can be used in organic light-emitting diodes (OLEDs) in electroluminescent displays or as backlighting, for example liquid-crystal displays (LCDs), in photovoltaic applications or for sensors, for electrophotographic recording and other semiconductor applications.

Since the copolymers according to the present invention have good solubility, they can be applied to the substrates as solutions or dispersions. Layers can therefore be applied with inexpensive processes, for example spin-coating or printing.

Suitable solvents or solvent mixtures comprise, for example, alkanes, aromatics, ester, ketones and especially their halogenated derivatives.

FETs and other components comprising semiconductor materials, for example diodes, can be used advantageously in ID tags or security labels in order to indicate authenticity and to prevent forgeries of valuable items such as banknotes, credit cards, identity documents such as ID cards or driving licenses or other documents with pecuniary advantage such as rubber stamps, postage stamps or tickets, etc.

Alternatively, the polymers according to the present invention can be used in organic light-emitting diodes (OLEDs), for example in displays or as backlighting for liquid-crystal displays (LCDs). Typically, OLEDs have a multilayer structure. A light-emitting layer is generally embedded between one or more electron- and/or hole-transporting layers. When an electrical voltage is applied, the electrons or holes can migrate in the direction of the emitting layer, where their recombination to the excitation and subsequent luminescence of the luminophoric compounds in the emitting layer. The polymers, materials and layers may, according to their electrical and optical properties, find use in one or more of the transport layers and/or emitting layers. When the compounds, materials or layers are electroluminescent or have electroluminescent groups or compounds, they are particularly suitable for the emitting layer.

Like the processing of suitable polymers for use in OLEDs, the selection is common knowledge and is described, for example, in Synthetic Materials, 111-112 (2000), 31-34 or J. Appl. Phys., 88 (2000) 7124-7128.

Various deposition techniques, including deposition from various solution processing techniques, have been used with organic semiconductors. For example, much of the printed electronics technology has focused on inkjet printing, primarily because this technique offers greater control over feature position and multilayer registration. Inkjet printing is a non-contact process, which offers the benefits of not requiring a preformed master (compared to contact printing techniques), as well as digital control of ink ejection, thereby providing drop-on-demand printing. Micro dispensing is another non-contact method of printing. However, contact printing techniques have the advantage of being well-suited for very fast roll-to-roll processing. Exemplary contact printing techniques include, but are not limited to, screen-printing, gravure printing, offset printing, flexographic printing, lithographic printing, pad printing, and microcontact printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like. Other solution processing techniques include, for example, spin coating, drop-casting, zone casting, dip coating, blade coating, or spraying.

Various articles of manufacture including electronic devices, optical devices, and optoelectronic devices, such as field effect transistors (e.g., thin film transistors), photovoltaics, organic light emitting diodes (OLEDs), complementary metal oxide semiconductors (CMOSs), complementary inverters, D flip-flops, rectifiers, and ring oscillators, that make use of the compounds disclosed herein also are within the scope of the present teachings as are methods of making the same.

The present teachings, therefore, further provide methods of preparing a semiconductor material. The methods can include preparing a composition that includes one or more compounds disclosed herein dissolved or dispersed in a liquid medium such as solvent or a mixture of solvents, depositing the composition on a substrate to provide a semiconductor material precursor, and processing (e.g. heating) the semiconductor precursor to provide a semiconductor material (e.g. a thin film semiconductor) that includes a compound disclosed herein. In various embodiments, the liquid medium is an organic solvent, an inorganic solvent such as water, or combinations thereof. In some embodiments, the composition can further include one or more additives independently selected from detergents, dispersants, binding agents, compatiblizing agents, curing agents, initiators, humectants, antifoaming agents, wetting agents, pH modifiers, biocides, and bacteriostats. For example, surfactants and/or other polymers (e.g., polystyrene, polyethylene, poly-alpha-methylstyrene, polyisobutene, polypropylene, polymethylmethacrylate, and the like can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone-casting, dip coating, blade coating, or spraying.

The present teachings further provide articles of manufacture such as the various devices described herein that include a composite having a semiconductor material of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., SiO$_2$, Al$_2$O$_3$, HfO$_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., described in Yoon, M-H. et al., PNAS, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene)poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Other articles of manufacture in which materials of the present teachings are useful are photovoltaics or solar cells. Components of the present teachings can exhibit broad optical absorption and/or a very positively shifted reduction potential, making them desirable for such applications. Accordingly, the substances described herein can be used as a p-type semiconductor in a photovoltaic design, which includes an adjacent n-type semiconducting material that forms a p-n junction. The compounds can be in the form of a thin film semiconductor, which can be deposited on a substrate to form a composite. Exploitation of small molecules of the present teachings in such devices is within the knowledge of a skilled artisan.

Accordingly, another aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures. FIG. 1 illustrates the four common types of OFET structures: top-contact bottom-gate structure (a), bottom-contact bottom-gate structure (b), bottom-contact top-gate structure (c), and top-contact top-gate structure (d). As shown in FIG. 1, an OFET can include a dielectric layer (e.g., shown as 8, 8', 8", and 8''' in FIGS. 1a, 1b, 1c, and 1d, respectively), a semiconductor layer (e.g., shown as 6, 6', 6", and 6''' in FIGS. 1a, 1b, 1c, and 1d, respectively), a gate contact (e.g., shown as 10, 10', 10", and 10''' in FIGS. 1a, 1b, 1c, and 1d, respectively), a substrate (e.g., shown as 12, 12', 12", and 12''' in FIGS. 1a, 1b, 1c, and 1d, respectively), and source and drain contacts (e.g., shown as 2, 2', 2", 2''', 4, 4', 4", and 4''' in FIGS. 1a, 1b, 1c, and 1d, respectively).

In certain embodiments, OTFT devices can be fabricated with the present compounds on doped silicon substrates, using $SiO_2$ as the dielectric, in top-contact geometries. In particular embodiments, the active semiconducting layer which incorporates at least a material of the present teachings can be deposited at room temperature or at an elevated temperature. In other embodiments, the active semiconducting layer which incorporates at least a compound of the present teachings can be applied by spincoating or printing as described herein. For top-contact devices, metallic contacts can be patterned on top of the films using shadow masks.

All quantitative data (percentages, ppm, etc.) are based on the weight, based on the total weight of the mixture, unless stated otherwise.

EXAMPLES

Example 1

Preparation of 1,3-Bis(trimethylstannyl)-thieno[3,2-b]thiophene

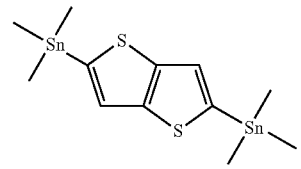

1 g (7.1 mmol) thieno[3,2-b]thiophene are dissolved in 40 ml anhydrous THF under argon and cooled to −78° C. 11 ml (17.6 mmol) of a 1.6 M tert-butyllithium solution in pentane are added slowly. The mixture is stirred for 2 hours at −78° C., then 4 g (20 mmol) trimethyltin chloride are added as solid. The solution is warmed to room temperature and, stirred for one hour. The solution is diluted with 100 ml diethylether, extracted with aqueous sodium bicarbonate solution, dried and evaporated. The residue is crystallized from acetonitrile at −20° C. to yield 1.9 g (58%) of colorless crystals. Mp=130° C., MS (FD, 8 kV) m/z=465.4 g/mol—calculated: 465.9 g/mol for $C_{12}H_{20}S_2Sn_2$; $^1$H-NMR (300 MHz, $CD_2Cl_2$, RT): δ 7.28 (s, 2H), δ 0.41 (s, 2H); $^{13}$C-NMR (75 MHz, $CD_2Cl_2$, RT): δ 148.0, 142.0, 16.6, −8.0; elemental analysis: found 30.91%, 4,48% H, 13.61% S—calculated: 30.94% C, 4.33% H, 13.77% S.

Example 2

Preparation of 1,3-Bis(3-hexadecynylthiophene-2-yl)-thieno[3,2b]thiophene

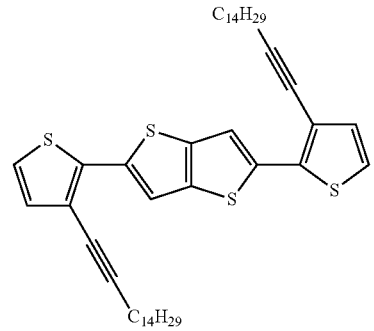

932 mg (2 mmol) 1,3-bis(trimethylstannyl)-thieno[3,2-b]thiophene and 843 mg (2.2 mmol) 2-bromo-3-hexadecynylthiophene are dissolved in 20 ml anhydrous o-dichlorobenzene under argon. 61 mg (0.2 mmol) tri-o-tolylphosphine and 47 mg (50 μmol) $Pd_2(dba)_3$ are added. The solution is heated to 120° C. for three hours. The solvent is removed in high vacuum. The residue is purified by column chromatography on silica gel with petroleum ether-dichloromethane (17:3 v/v) as eluent. After crystallization from hexane at 0° C., 950 mg (64%) of an orange-yellow powder are obtained. Mp=71° C.; MS (FD, 8 kV) m/z=743.3 g/mol—calculated: 744.4 g/mol for $C_{46}H_{64}S_4$; $^1$H-NMR (250 MHz, $CD_2Cl_2$, RT): δ 7.68 (s, 2H), δ 7.14 (d, J=5.3 Hz, 2H), δ 7.02 (d, J=5.3 Hz, 2H), δ 2.54 (t, J=7.0 Hz, 4H), δ 1.69 (quin, J=7.4 Hz, 4H), δ 1.6-1.1 (m, 48H), δ 0.89 (t, J=6.5 Hz, 6H); $^{13}$C-NMR (62.5 MHz, $CD_2Cl_2$, RT): δ 140.0, 138.99, 138.94, 132.3, 123.7, 119.2, 117.5, 97.4, 76.6, 32.6, 30.4-30.2 (multiple peaks), 30.0, 29.9, 29.7, 29.1, 23.3, 14.5; elemental analysis: found 74.00% C, 8.62% H, 17.30% S calculated: 74.14% C, 8.66% H, 17.21% S.

Example 3

Preparation of 4,8-Bis(tetradecyl)-dithienobenzo-thieno[3,2-b]thiophene

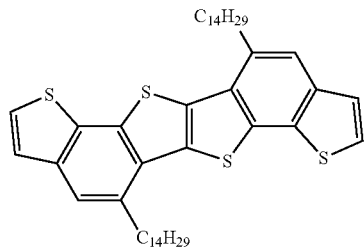

500 mg (0.67 mmol) 1,3-bis(3-hexadecynylthiophene-2-yl)-thieno[3,2-b]thiophene are dissolved in 15 ml NMP. After degassing the solution, 0.11 ml (0.74 mmol) DBU are added. The resulting solution is refluxed over night, cooled to room temperature, diluted with 20 ml methanol and filtered. The yellow solid is recrystallized from hexane to give 390 mg (78%) slightly yellow fine needles. Mp=118° C.; MS (FD, 8 kV) m/z=743.5 g/mol—calculated: 744.4 g/mol for $C_{46}H_{64}S_4$; $^1$H-NMR (500 MHz, $C_2D_2Cl_4$, 60° C.): δ 7.65 (s, 2H), δ 7.40 (d, J=5.2 Hz, 2H), δ 7.38 (d, J=5.2 Hz, 2H), δ 3.20 (t, J=7.9 Hz, 4H), δ 1.85 (quin, J=7.7 Hz, 4H), δ 1.56 (quin, J=7.6 Hz, 4H)), δ 1.39 (quin, J=7.5 Hz, 4H); δ 1.3-1.1 (m, 36H), δ 0.82 (t, J=7.0 Hz, 6H); $^{13}$C-NMR (125 MHz, $C_2D_2Cl_4$, 60° C.): δ 138.3, 136.5, 134.2, 132.1, 131.8, 130.0, 125.1, 125.0, 120.8, 34.8, 32.2, 31.3, 29.9 (multiple peaks), 29.8, 29.6, 22.9, 14.4; elemental analysis: found 74.12% C, 8.67% H, 17.04% S—calculated: 74.14% C, 8.66% H, 17.21% S.

Example 4

Preparation of 2,8-Bistrimethylstannyl-5,12-bis(tetradecyl)-dithienobenzo-thieno[3,2-b]thiophene

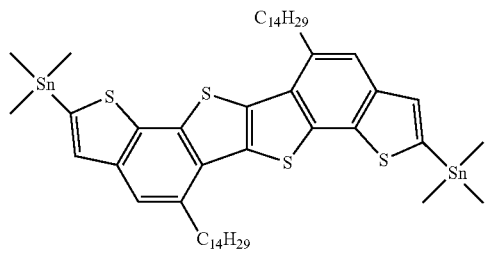

74.5 mg (0.1 mmol) 4,8-bis(tetradecyl)-dithienobenzo-thieno[3,2-b]thiophene are suspended in 5 ml anhydrous THF under an argon atmosphere. The suspension is cooled to 0° C., 0.16 ml (0.25 mmol) tertiary butyllithium (1.6M in pentane) are added slowly whereupon the suspension turns from light yellow to dark brown. The mixture is stirred for two hours at 0° C. while the color brightens up again. 50 mg (0.25 mmol) trimethyltin chloride in 2 ml THF is added slowly, the mixture is warmed up to room temperature and stirred for one hour at that temperature. 20 ml methanol are added, the precipitate is filtered off and recrystallized twice from ethyl acetate at 4° C. to obtain 45 mg of yellow needles. Mp'=67° C.; MS (FD, 8 kV) m/z=1070.1 g/mol—calculated: 1070.3 g/mol for $C_{52}H_{80}S_4Sn_2$; $^1$H-NMR (250 MHz, $CD_2Cl_2$): δ 7.67 (s, 2H), δ 7.51 (s, 2H), δ 3.23 (t, J=7.7 Hz, 4H), δ 1.87 (quin., J=7.6 Hz, 4H), δ 1.59 (quin, J=7.4 Hz, 4H), δ 1.4-1.1 (m, 40H)), δ 0.87 (t, J=6.5 Hz, 6H); δ 0.48 (s, 18H), $^{13}$C-NMR (75 MHz, $CD_2Cl_2$): δ 140.2, 139.6, 136.8, 136.2, 134.2, 133.2, 132.1, 129.5, 120.4, 35.3, 32.5, 31.7, 30.3 (multiple peaks), 30.2, 29.9, 23.3, 14.5; elemental analysis: found 58.84% C, 7.66% H, 11.38% S—calculated: 58.33% C, 7.53% H, 11.98% S.

Example 5a

Preparation of Poly(2,8-Bis-3-tetradecylthiophene-2-yl)-5,12-bis(tetradecyl)-dithienobenzo-thieno[3,2-b]thiophene

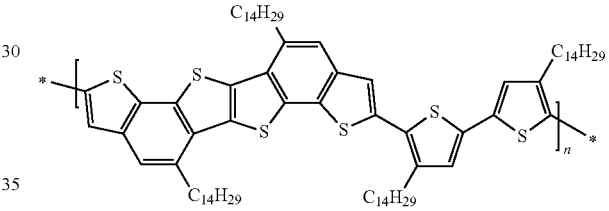

32.13 mg (30 μmol) 2,8-Bistrimethylstannyl-5,12-bis(tetradecyl)-dithienobenzo-thieno[3,2-b]thiophene and 21.50 mg (30 μmol) 5,5'-dibromo-4,4'-didodecyl-2,2'-dithiophene are dissolved in 2 ml anhydrous 1,2-dichlorobenzene under argon. 1.2 mg (4 μmol) tri-o-tolylphosphine and 0.9 mg (1 μmol) $Pd_2(dba)_3$ are added. The resulting mixture is heated to 140° C. for three days. The solution is diluted with 1,2-dichlorobenzene and precipitated in methanol. After filtration the polymer is reprecipitated twice in methanol and dried. 31 mg of a red solid is obtained (80%). GPC (1,2,4-trichlorobenzene, 135° C.) analysis gives $M_n$=8 kg/mol and $M_w$=16 kg/mol against polystyrene standard. $^1$H-NMR (500 MHz, $C_2D_2Cl_4$, 120° C., δ in ppm): 7.6 (br, 2H), 7.5 (br, 2H), 7.2 (br, 2H).

Example 5b

Alternative Preparation Method 107.09 mg (0.1 mmol) 2,8-Bistrimethylstannyl-5,12-bis(tetradecyl)-dithienobenzothieno[3,2-b]thiophene and 71.68 mg (0.1 mmol) 5,5'-dibromo-4,4'-didodecyl-2,2'-dithiophene are dissolved in 1 ml toluene in the glove box in a microwave tube. After addition of 5 mg (5 μmol) $Pd(PPh_3)_4$ as catalyst, the tube is sealed and subject to microwave irradiatation (330 W). The temperature is kept at 120° C. for 5 minutes, then at 140° C. for another 5 minutes, and finally at 155° C. for 40 minutes. The partially precipitated polymer is dissolved in 1,2-dichlorobenzene, precipitated in methanol, reprecipitated and subject to soxhlet extraction with acetone for 12 hours. 110 mg of a red polymer are obtained (85%). GPC (1,2,4-trichlorobenzene, 135° C.) analysis gives $M_n$=17 kg/mol and $M_w$=43 kg/mol against polystyrene standard Example 6

FET Device Preparation and Measurement

For the transistor, heavily doped silicon wafers with a 200 nm thick thermally grown silicon dioxide layer were used as substrates. Hexamethyldisilazane was deposited out of the gas phase at 120° C. The semiconductor polymeric film was prepared by pincoating (3000 rpm, 60 s) a 5 mg ml$^{-1}$ 1,2-dichlorobenzene solution (roughly 47.5 nm thick). After annealing the substrate at 100° C. for 5 min and slow cooling (1° C. min$^{-1}$), source and drain electrodes were fabricated by vapor-depositing gold (3*10$^{-6}$ mbar, 1 Å s$^{-1}$, ~100 nm thick) onto the semiconductor thin films through a shadow mask to obtain devices with channel lengths of between 25-75 μm and of widths about 0.5 to 1.5 mm (W L$^{-1}$=20). All preparations and electrical measurements using a Keithley 4200 semiconductor parameter analyzer were performed under nitrogen atmosphere in yellow light.

The charge carrier (field effect) mobility was calculated in saturation from the equation $$\mu_{sat} = \frac{2I_{SD}L}{WC_i(V_{SG} - V_{th})^2}$$

The results were as follows:
Field-Effect Mobility:

$\mu_{sat}$=1.29(±0.28)*10$^{-cm^2}$/Vs(average of five measurements)

On-Off Ratio:

$O_{on}/I_{off}$=3.8(±0.2)*10$^3$(average of five measurements)

The invention claimed is:
1. A dithienobenzo-thieno[3,2-b]thiophene-copolymer of formula (I):

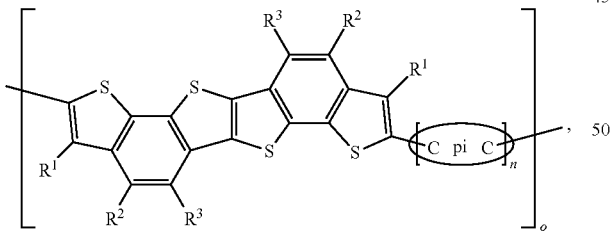

wherein:
pi is a monocyclic or polycyclic moiety optionally substituted with 1-4 $R^a$ groups, wherein:
$R^a$, at each occurrence, is independently hydrogen or a) a halogen, b) —CN, c) —NO$_2$, d) oxo, e) —OH, f) =C($R^b$)$_2$, g) a C$_{1-20}$ alkyl group, h) a C$_{2-20}$ alkenyl group, i) a C$_{2-20}$ alkynyl group, j) a C$_{1-20}$ alkoxy group, k) a C$_{1-20}$ alkylthio group, l) a C$_{1-20}$ haloalkyl group, m) a —Y—C$_{3-10}$ cycloalkyl group, n) a —Y—C$_{6-14}$ aryl group, o) a —Y-3-12 membered cycloheteroalkyl group, or p) a —Y-5-14 membered heteroaryl group, wherein each of the C$_{1-20}$ alkyl group, the C$_{2-20}$ alkenyl group, the C$_{2-20}$ alkynyl group, the C$_{3-10}$ cycloalkyl group, the C$_{6-14}$ aryl or haloaryl group, the 3-12 membered cycloheteroalkyl group, and the 5-14 membered heteroaryl group is optionally substituted with 1-4 $R^b$ groups;
$R^b$, at each occurrence, is independently a) a halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_m$H, l) —S(O)$_m$—C$_{1-20}$alkyl, m) —S(O)$_2$OH, n) —S(O)$_m$—OC$_{1-20}$ alkyl, o) —S(O)$_m$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S)NH—C$_{6-14}$ aryl, ah) —S(O)$_m$NH$_2$, ai) —S(O)$_m$NH(C$_{1-20}$ alkyl), aj) —S(O)$_m$N(C$_{1-20}$ alkyl)$_2$, ak) —S(O)$_m$NH(C$_{6-14}$ aryl), al) —S(O)$_m$N(C$_{1-20}$ alkyl)-C$_{6-14}$ aryl, am) —S(O)$_m$N(C$_{6-14}$ aryl)$_2$, an) SiH$_3$, ao) SiH(C$_{1-20}$ alkyl)$_2$, ap) SiH$_2$(C$_{1-20}$ alkyl), ar) —Si(C$_{1-20}$ alkyl)$_3$, as) a C$_{1-20}$ alkyl group, at) a C$_{2-20}$ alkenyl group, au) a C$_{2-20}$ alkynyl group, av) a C$_{1-20}$ alkoxy group, aw) a C$_{1-20}$ alkylthio group, ax) a C$_{1-20}$ haloalkyl group, ay) a C$_{3-10}$ cycloalkyl group, az) a C$_{6-14}$ aryl or haloaryl group, ba) a 3-12 membered cycloheteroalkyl group, or bb) a 5-14 membered heteroaryl group;
Y, at each occurrence, is independently a divalent C$_{1-6}$alkyl group, a divalent C$_{1-6}$haloalkyl group, or a covalent bond; and
m, at each occurrence, is independently 0, 1 or 2;
$R^1$, $R^2$, and $R^3$, at each occurrence, are independently H, a halogen, CN, a C$_{1-30}$ alkyl group, a C$_{2-30}$ alkenyl group, a C$_{1-30}$ haloalkyl group, a C$_{2-30}$ alkynyl group, a C$_{1-30}$ alkoxy group, a C(O)—C$_{1-20}$ alkyl group, a C(O)—OC$_{1-20}$ alkyl group, a Y—C$_{3-10}$ cycloalkyl group, a —Y-3-12 membered cycloheteroalkyl group, each optionally substituted with 1-5 substituents selected from the group consisting of a halogen, —CN, a C$_{1-6}$alkyl group, a C$_{1-6}$alkoxy group, and a C$_{1-6}$haloalkyl group, -L-Ar$^1$, -L-Ar$^1$—Ar$^1$, -L-Ar$^1$—R$^4$, or -L-Ar$^1$—Ar$^1$—R$^4$
wherein:
L, at each occurrence, is independently —O—, —Y—O—Y—, —S—, —S(O)—, —Y—S—Y—, —C(O)—, —NR$^c$C(O)—, —NR$^c$—, —SiR$^c$$_2$—, —Y—[SiR$^c$$_2$]—Y—, a divalent C$_{2-30}$ alkyl group, a divalent C$_{1-30}$ alkenyl group, a divalent C$_{1-30}$ haloalkyl group, or a covalent bond;
wherein:
$R^c$, at each occurrence, is H, a C$_{1-20}$ alkyl group, or a —Y—C$_{6-14}$ aryl group;
Ar$^1$, at each occurrence, is independently a C$_{6-14}$ aryl group or a 5-14 membered heteroaryl group, each optionally substituted with 1-5 substituents selected from the group consisting of a halogen, —CN, a C$_{1-6}$alkyl group, a C$_{1-6}$ alkoxy group, and a C$_{1-6}$ haloalkyl group; and
$R^4$, at each occurrence, is independently a C$_{1-20}$ alkyl group, a C$_{2-20}$ alkenyl group, a C$_{1-20}$ haloalkyl group, a C$_{1-20}$ alkoxy group, -L'-Ar$^2$, -L-Ar$^2$—Ar$^2$, -L-Ar$^2$—R$^5$, or -L'-Ar$^2$—Ar$^2$—R$^5$;

wherein:
L', at each occurrence, is independently —O—, —Y—O—Y—, —S—, —S(O)—, —Y—S—Y—, —C(O)—, —NR$^c$C(O)—, —NR$^c$—, —Y—[SiR$^c_2$]—Y—, a divalent $C_{1-20}$ alkyl group, a divalent $C_{1-20}$ alkenyl group, a divalent $C_{1-20}$ haloalkyl group, or a covalent bond; Ar$^2$, at each occurrence, is independently a $C_{6-14}$ aryl group or a 5-14 membered heteroaryl group, each optionally substituted with 1-5 substituents selected from the group consisting of a halogen, —CN, a $C_{1-6}$alkyl group, a $C_{1-6}$alkoxy group, and a $C_{1-6}$haloalkyl group;
R$^5$, at each occurrence, is a $C_{1-20}$ alkyl group, a $C_{2-20}$ alkenyl group, a $C_{1-20}$ haloalkyl group, or a $C_{1-20}$ alkoxy group;

n=0, 1, 2; and
o=1-1 000.

2. A composition, comprising the polymer of claim 1 dissolved or dispersed in a liquid medium.

3. A thin film semiconductor, comprising the polymer of claim 1.

4. A composite, comprising:
a substrate; and
the thin film semiconductor of claim 3 deposited on the substrate.

5. A process for preparing a composite, the process comprising:
dissolving or dispersing the polymer of claim 1 in a liquid medium, to form a solution;
depositing the solution on a substrate; and
removing the solvent to form a thin film semiconductor comprising the polymer on the substrate.

6. The process of claim 5, wherein the solution is deposited by spin coating, drop casting, dip coating, or printing.

7. A field effect transistor device, comprising the thin film semiconductor of claim 3.

8. A photovoltaic device, comprising the thin film semiconductor of claim 3.

9. An organic light emitting diode device, comprising the thin film semiconductor of claim 3.

10. The composition of claim 2, wherein the polymer is dissolved in the liquid medium.

11. The composition of claim 2, wherein the polymer is dispersed in the liquid medium.

12. The process of claim 6, wherein the solution is deposited by spin coating.

13. The process of claim 6, wherein the solution is deposited by drop casting.

14. The process of claim 6, wherein the solution is deposited by dip coating.

15. The process of claim 6, wherein the solution is deposited by printing.

16. A field effect transistor device, comprising the composite of claim 4.

17. A photovoltaic device, comprising the composite of claim 4.

18. An organic light emitting diode device, comprising the composite of claim 4.

* * * * *

UNITED STATES PATENT AND TRADEMARK OFFICE
CERTIFICATE OF CORRECTION

PATENT NO. : 8,389,670 B2
APPLICATION NO. : 13/511890
DATED : March 5, 2013
INVENTOR(S) : Marcel Kastler et al.

It is certified that error appears in the above-identified patent and that said Letters Patent is hereby corrected as shown below:

On the title page, Item (73), the 1st Assignee's information is incorrect. Item (73) should read:

--(73)    Assignees: BASF SE, Ludwigshafen (DE);
          Max-Planck-Gesellshaft zur
          Foerderung der Wissenshaften e.V.,
          Munich (DE)--

Signed and Sealed this
Fourteenth Day of May, 2013

Teresa Stanek Rea
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,389,670 B2 | Page 1 of 1 |
| APPLICATION NO. | : 13/511890 | |
| DATED | : March 5, 2013 | |
| INVENTOR(S) | : Marcel Kastler et al. | |

It is certified that error appears in the above-identified patent and that said Letters Patent is hereby corrected as shown below:

On the title page, Item (73), the 1st Assignee's information is incorrect. Item (73) should read:

--(73)        Assignees: BASF SE, Ludwigshafen (DE);
Max-Planck-Gesellschaft zur Foerderung der Wissenschaften e.V., Munich (DE)--

This certificate supersedes the Certificate of Correction issued May 14, 2013.

Signed and Sealed this
Thirteenth Day of May, 2014

Michelle K. Lee
*Deputy Director of the United States Patent and Trademark Office*